(12) United States Patent
MacFarlane

(10) Patent No.: US 6,407,650 B1
(45) Date of Patent: Jun. 18, 2002

(54) SURFACE ACOUSTIC WAVE SHAPING SYSTEM

(75) Inventor: Duncan L. MacFarlane, Dallas, TX (US)

(73) Assignee: Board of Regents The University of Texas System, Austin, TX (US)

( * ) Notice: Subject to any disclaimer, the term of this patent is extended or adjusted under 35 U.S.C. 154(b) by 0 days.

(21) Appl. No.: 09/384,632

(22) Filed: Aug. 27, 1999

(51) Int. Cl.[7] .............. H03H 9/42; H03H 9/64; H03H 9/145
(52) U.S. Cl. ............ 333/193; 333/154; 310/313 B
(58) Field of Search ............... 333/150, 154, 333/193–196; 310/313 B

(56) References Cited

U.S. PATENT DOCUMENTS

| | | | | |
|---|---|---|---|---|
| 3,582,838 A | * | 6/1971 | DeVries | 310/313 B X |
| 3,654,574 A | * | 4/1972 | Dias | 333/154 |
| 3,697,899 A | * | 10/1972 | Dias | 310/313 B X |
| 4,013,983 A | * | 3/1977 | Hartemann | 333/195 |
| 4,049,982 A | * | 9/1977 | Cohen | 310/313 B |
| 4,422,000 A | | 12/1983 | Yamada et al. | 310/313 D |
| 5,189,330 A | * | 2/1993 | Niitsuma | 333/195 X |
| 5,300,902 A | | 4/1994 | Satoh et al. | 333/193 |
| 5,374,863 A | * | 12/1994 | Mochizuki et al. | 310/313 B X |
| 5,558,711 A | | 9/1996 | Sakurai | 117/84 |
| 5,815,055 A | * | 9/1998 | Eguchi et al. | 310/313 B X |
| 5,838,091 A | | 11/1998 | Watanabe | 310/313 C |
| 5,889,357 A | | 3/1999 | Yachi et al. | 310/344 |

FOREIGN PATENT DOCUMENTS

| | | | | |
|---|---|---|---|---|
| JP | 55-70118 | * | 5/1980 | 333/195 |
| JP | 58-21559 | * | 2/1983 | 73/609 |
| JP | 6-314946 | * | 11/1994 | 310/311 |

\* cited by examiner

*Primary Examiner*—Robert Pascal
*Assistant Examiner*—Barbara Summons
(74) *Attorney, Agent, or Firm*—Sanford E. Warren, Jr.; Edwin S. Flores; Gardere Wynne Sewell LLP

(57) ABSTRACT

A system (200) for transmitting and focusing surface acoustic waves (208) along a substrate (206) is disclosed. The system (200) comprising a curved transmission element (202) that is disposed upon the substrate (206). The curved transmission element (202) is adapted to propagate an acoustic wave (212). The system (200) also comprises a curved receiving element (206) that is disposed upon the substrate in relation to the curved transmission element (202). The curved receiving element (206) is adapted to receive the acoustic wave (212) and match the acoustic wave's size and shape.

39 Claims, 3 Drawing Sheets

SURFACE ACOUSTIC WAVE SHAPING SYSTEM

TECHNICAL FIELD OF THE INVENTION

The present invention relates, in general, to the field of surface acoustic wave devices, and in particular, to a system for providing precision filters and oscillators that uses a curved transceiving element.

BACKGROUND OF THE INVENTION

Surface acoustic wave (SAW) devices are used extensively in modern electronic systems, especially in those involving communications or signal processing applications. A SAW device is formed starting with a piezoelectric substrate, onto the surface of which electrodes (also referred to as antennas) or other transceiving elements are patterned using known photolithographic processes. Typically, a transmitting set and a receiving set of multiple, inter-digited electrodes are formed into a lattice configuration.

The inter-digited electrodes now disposed upon the piezoelectric substrate operate to convert a voltage into a surface acoustic wave, or a surface acoustic wave into voltage. Specifically, as voltage is applied to the transmitting electrodes, an acoustic wave is formed in the substrate, due to the piezoelectric effect. The acoustic wave propagates in the substrate at a given velocity that differs depending upon the direction of propagation. Many devices operate in the surface mode, in which the relevant velocity is the surface acoustic velocity. When the acoustic wave reaches the receiving electrodes, the acoustic energy is reconverted to electric energy.

Designers may thus employ SAW devices to provide filter and oscillator functions in a signal processing or communication application. In such applications, a technical measure of SAW efficacy may be referred to as Quality factor (Q). Quality factor may be calculated by the formula $Q = \omega / \Delta\omega$; where $\omega$ represents the frequency of operation and $\Delta\omega$ represents the variance of the frequency. Variance of the frequency may be affected by a number of factors including transmission losses, phase jitter, and other distortions which may be intentionally and unintentionally introduced.

For a given frequency, the quality factor Q may be increased providing more precise filters and oscillators. This may be accomplished by increasing frequency or by decreasing the variance (or a combination of the two). Variance increases with losses in transmission of the acoustic wave, including diffractive losses. It is critical, therefore, to curtail diffractive losses in high precision SAW applications.

It has been found that in conventional SAW devices employing linear electrodes, the diffractive losses are unnecessarily high which causes a high variance and a low Q value. This phenomenon is illustrated in FIG. 1 wherein a conventional SAW device 100 uses linear electrodes. Transmitting electrode 102 propagates waves towards receiving electrode 104, as shown by wave fronts 106. As waves 106 are propagated from electrode 102, they are diffractively altered in size and shape over the course of transmission. As they arrive at electrode 104, waves 106 exceed the receiving area of electrode 104, resulting in portions 108 of the wave being lost.

A further problem with straight electrodes pertains to phase delay errors caused by a variance in arrival time of the acoustic signal across the receiving electrode. In the standard SAW device configuration of parallel, straight transmitting and receiving electrodes, the leading phase front of an acoustic signal arrives at the center of the receiving electrode before arriving at the tips of the receiving electrodes. This spread, or dispersion, in arrival time lowers performance of the device by increasing $\Delta\omega$ and lowering Q.

Some conventional systems have attempted to address this by significantly increasing the size of receiving electrodes. This approach, however, has unacceptable impacts on system efficiency and costs. Other conventional systems have used shaping and positioning of electrodes in an attempt to reflect acoustic waves. Mere redirection, however, fails to address diffractive losses, resulting in a low Q value. While other conventional systems have attempted to reduce variance emanating from the coupling of electrodes to a substrate, reduction of diffractive losses remains unaddressed.

A need has, therefore, arisen for a surface acoustic wave system that curtails diffractive losses. A need has also arisen for such a surface acoustic wave system that provides for optimal Q value. A need has further arisen for such a surface acoustic wave system that has increased precision.

SUMMARY OF THE INVENTION

In the present invention, a surface acoustic wave system curtails diffractive losses and phase delay errors by shaping an acoustic wave for propagation. The surface acoustic wave system of the present invention provides for a high Q value. The surface acoustic wave system of the present invention has increased precision which improves its performance, particularly when used as a filter or oscillator.

In the surface acoustic wave system of the present invention, curved transmission elements are provided in order to shape a wave for propagation. Curved receiving elements are provided in order to match the shape and size of the propagating wave front, thereby fully receiving the wave at a definite arrival time and eliminating diffractive losses.

In one embodiment of the present invention, both the transmission and receiving elements are semi-circular in shape. The elements are curved concavely with respect to one another and satisfy a defined size and positional relationship. Alternatively, both transceiving elements of the present invention may be semi-elliptical or substantially parabolic in shape, providing necessary wave front matching.

In other embodiments, a transmission element may be shaped differently than, and curved either concavely or convexly with respect to, a receiving element; where the receiving element provides necessary wave front matching.

In one embodiment of the present invention, a transmission element may be linearly shaped and combined with a semi-circular receiving element to satisfy a defined size and positional relationship.

In yet another embodiment, a transmission element is curved either concavely or convexly with respect to, and combined with, an array of receiving elements, where each receiving element provides necessary wave front matching. This system provides a phase sensitive processing capability.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The SAW design of the present invention provides greater precision in filtering and oscillator applications. The curvature of the electrodes of the present invention provides a precise focusing of an acoustic wave upon propagation and a matching of wave front size and shape, resulting in reception without diffraction loss.

Figure 1:
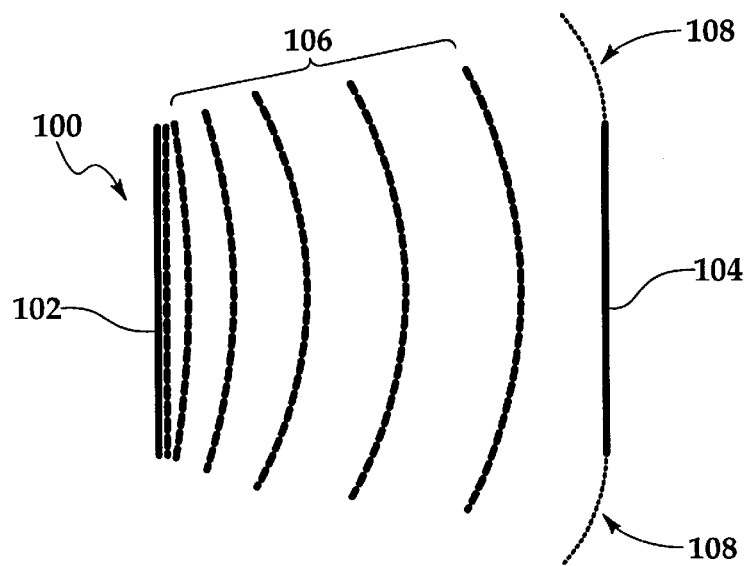
FIG. 1 is an illustration of a prior art SAW device having linear electrodes.
Figure 2:
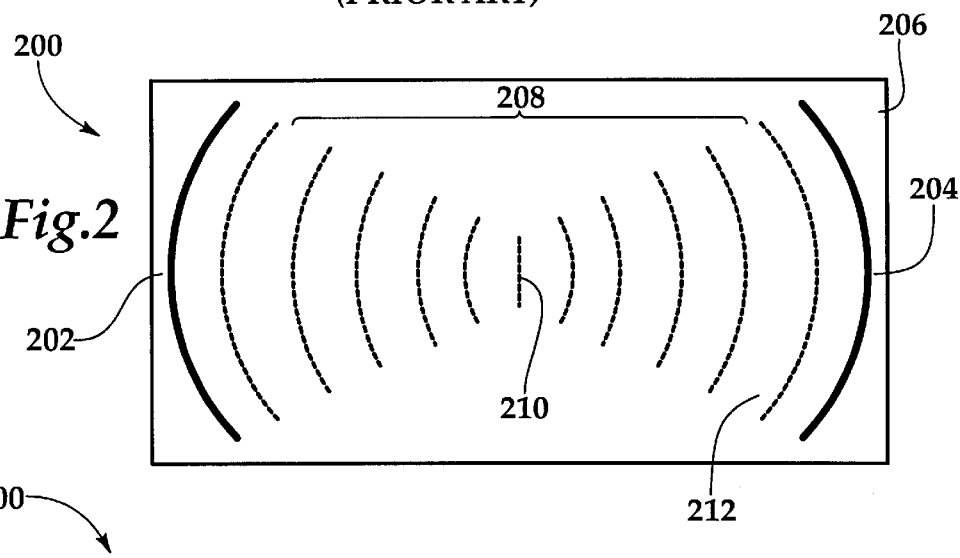
FIG. 2 is a schematic illustration of a SAW device, having curved electrodes, according to the present invention.

The principles of a SAW device 200 according to the present invention are illustrated in FIG. 2. Device 200 incorporates transmission element 202 and receiving element 204, both transmissively coupled to a substrate 206. Substrate 206 is typically a piezoelectric material, such as lithium tantalate or quartz. Other materials may be employed as desired to realize the benefits of the present invention. Similarly, elements 202 and 204 may be realized in a number of ways. Elements 202 and 204 are typically electrodes, though other contrivances may be employed based on desired operational characteristics. It should be apparent to those skilled in the art that elements 202 and 204 may be initially formed and then coupled to substrate 206, or they may be formed directly on substrate 206, by known methods such as deposition. All such possibilities are comprehended by the present invention.

Element 202 is engaged and begins propagating wave fronts 208 across the substrate 206. The curvature of element 202 constrains the shape of the wave front path and focuses that path into progressively smaller and straighter wave fronts, through a convergence point 210 at which the wave front is substantially linear and tightly focused. Passing point 210, the wave front path diffracts into progressively larger and more curvaceous wave fronts. As wave front 212 approaches element 204, it comprises a certain size and curvature. Element 204 is designed to be of optimal size and curvature, and is positioned in relation to element 202 such that element 204 fully receives wave 212 without diffractive loss. It will be apparent to one of skill in the art that the size and position of transmitter 202 and/or receiver 204 may be designed to coincide with any of the wave fronts 208 along the wave front path. In addition, it should be apparent to one of skill in the art that SAW device 200 of the present invention reduces frequency variance, thereby providing a SAW system with high precision.

Figure 3:
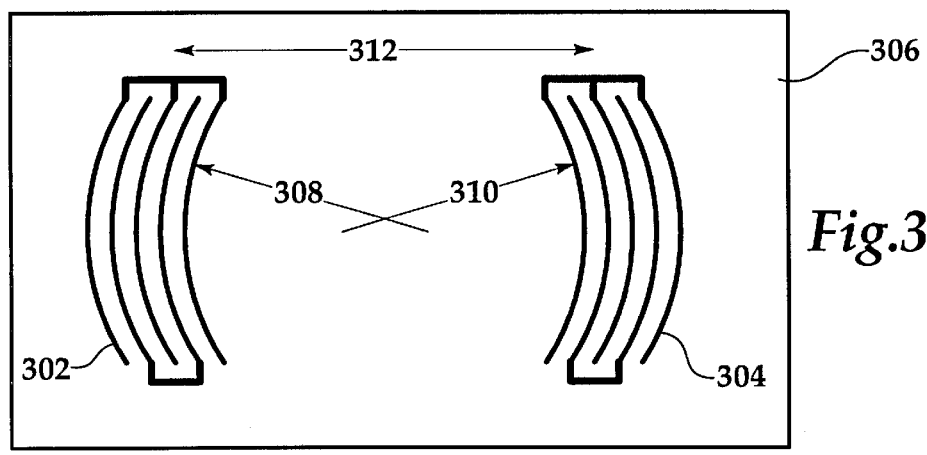
FIG. 3 is a schematic illustration of a SAW device having curved electrodes, according to the present invention.

Referring now to FIG. 3, a SAW device of the present invention is depicted and generally designated 300. A transmitting element 302 and receiving element 304 are disposed upon a substrate 306. In the illustrated embodiment, elements 302 and 304 are depicted as interdigited electrodes, though, as previously noted, other implementations of the present invention may be employed. Within this embodiment, elements 302 and 304 are disposed in relation to one another in accordance with a constraint.

This constraint may be understood with respect to certain characteristics of elements 302 and 304. Element 302 has a radius of curvature 308. Similarly, element 304 has a radius Is of curvature 310. In this embodiment, elements 302 and 304 are concave with respect to one another. As such, radii 308 and 310 would be considered to be positive values. Elements 302 and 304 are spaced apart at distance 312. Provided that:

$$0 \le \left[1 - \frac{\text{distance} 312}{\text{radius} 308}\right]\left[1 - \frac{\text{distance} 312}{\text{radius} 310}\right] \le 1$$

the SAW system will propagate and receive without diffraction loss.

It should be appreciated by those skilled in the art that, within the context of this constraint, some special cases give rise to a symmetry of the condition. One such case is where radii 308 and 310 are both equivalent to distance 312. Another such case is when radius 308 equals infinity (indicating element 302 is linear) and radius 310 equals one half of distance 312. In both such cases, due to the symmetry of the condition, the curvature of the mirrors may be interchanged.

It should also be appreciated by those skilled in the art that, as illustrated above and more generally, the radii of curvature and the distance between elements can be varied to achieve a wide variety of functionality and to suit a great number of design requirements.

Figure 4A:
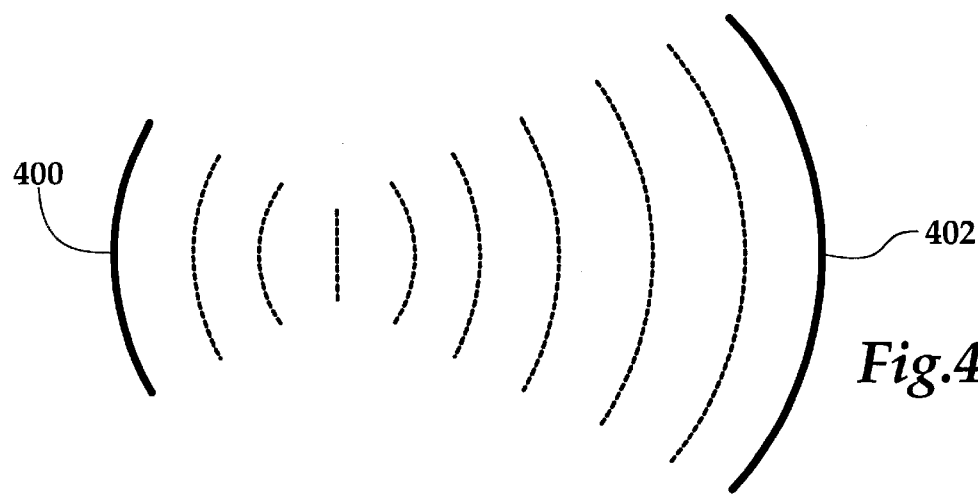
FIG. 4A is a schematic illustration of curved electrodes for use in a SAW device, according to the present invention.
Figure 4B:
FIG. 4B is a schematic illustration of curved electrodes for use in a SAW device, according to the present invention.

FIGS. 4A and 4B illustrate embodiments wherein the size and position of the elements have been selected to coincide with the wave front on the wave front path. Although not depicted, it should be understood that, as in the previous embodiments, transmitter and receiver elements are disposed upon a substrate. In FIG. 4A, transmitter 400 is of a smaller size and greater radius of curvature than receiver 402. As such, transmitter 400 focuses waves more immediately, and a convergence point is formed closer to transmitter 400. Receiver 402 is still formed of a size and shape suitable to fully receive the wave fronts as they arrive. Conversely, but in similar fashion, the transmitter may be of greater size and smaller radius of curvature than the receiver, as depicted in FIG. 4B. Transmitter 404 focuses waves through a convergence point which is closer to receiver 406. Receiver 406 is still designed to be of a shape and size suitable to fully receive propagated wave fronts.

Figure 5:
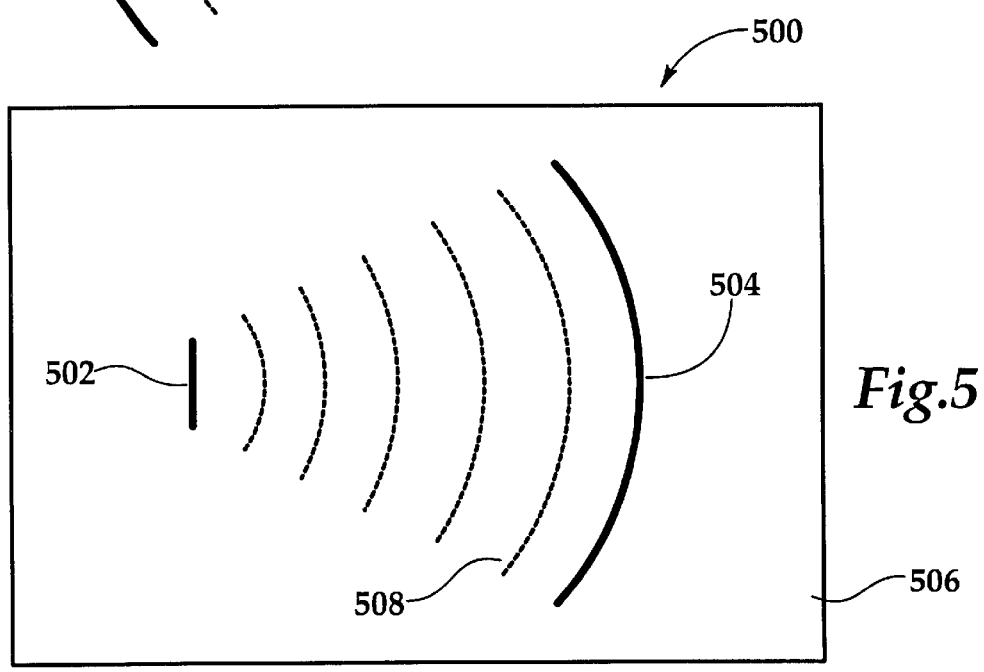
FIG. 5 is a schematic illustration of a linear transmitting electrode and a curved receiving electrode for use in a SAW device, according to the present invention.

FIG. 5 depicts another embodiment of the present invention in which a linear transmitting element is employed in conjunction with a curved receiving element. SAW device 500 comprises transmitter 502 and receiver 504 disposed upon a substrate 506. Transmitter 502 has an infinite radius of curvature (indicating linearity) and is designed to be of a size coinciding with a wave front at a convergence point. Receiver 504 is designed to be of optimal size and curvature, and is positioned in relation to element 502 such that element 504 fully receives wave 508 without diffractive loss.

An alternative embodiment, not shown, wherein the size and shape of elements 502 and 504 are interchanged, is possible if those elements are designed in accordance with the constraints previously described in relation to FIG. 3.

Figure 6A:
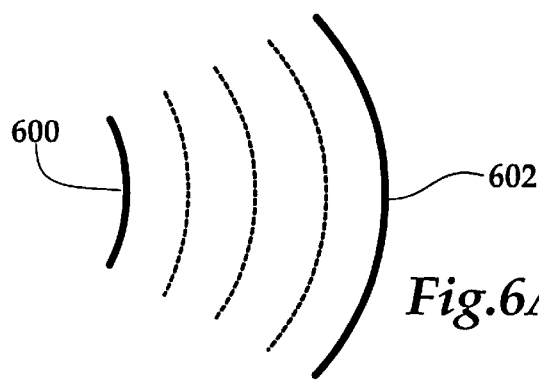
FIG. 6A is a schematic illustration of curved electrodes, according to the present invention.
Figure 6B:
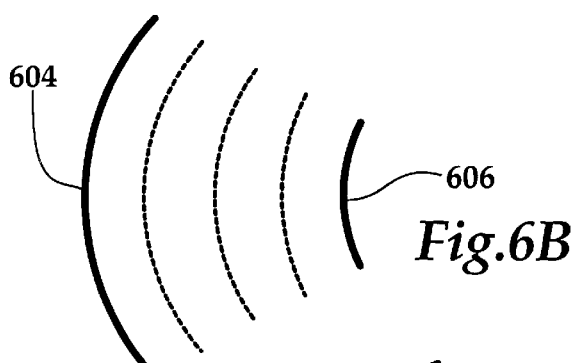
FIG. 6B is a schematic illustration of curved electrodes for use in a SAW device, according to the present invention.

FIGS. 6A and 6B illustrate other embodiments of the present invention. Again, it should be understood that although not depicted, transmitter and receiver elements are disposed upon a substrate. In FIG. 6A, transmitter 600 is of a smaller size than receiver 602, and has a greater magnitude for its curvature radius. However, transmitter 600 is curved convexly with respect to receiver 602, effectively rendering its radius of curvature negative. As such, transmitter 600 is positioned such that a convergence point is not formed and wave fronts are focused directly into receiver 602. Receiver 602 is still formed of a size and shape suitable to fully receive the wave fronts as they arrive. Conversely, but in similar fashion, the transmitter may be of greater size and opposing radius of curvature than the receiver, as depicted in FIG. 6B. Transmitter 604 focuses waves directly onto receiver 606. Receiver 606 is designed to be of a shape and size suitable to fully receive the focused wave fronts.

Figure 7:
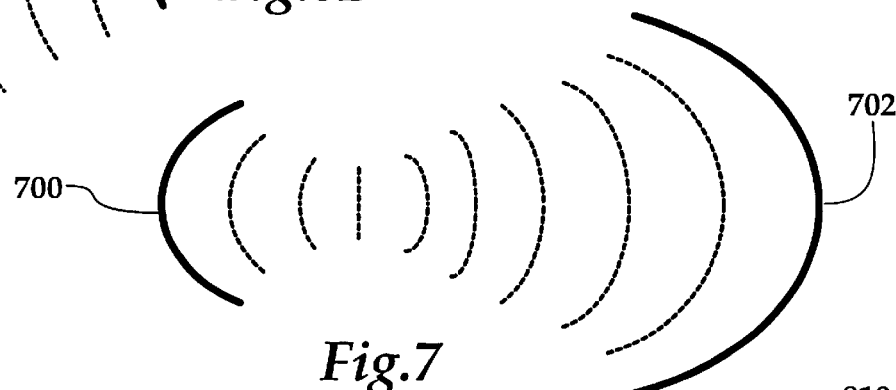
FIG. 7 is a schematic illustration of curved electrodes for use with a SAW device, according to the present invention.

Referring now to FIG. 7, an alternative embodiment of a SAW device according to the present invention is depicted. Transmission element 700 and receiving element 702 are both of an elliptical shape. It should be understood that, alternatively, the principles of the present invention may be practiced with both elements of a substantially parabolic shape, or any other curved or arced shape. The elliptical curvature of element 700 constrains the shape of the wave front path and focuses that path into progressively smaller and straighter wave fronts, through a convergence point. Passing that convergence point, the wave front path diffracts into progressively larger and more elliptical wave fronts. Element 702 is designed to be of optimal size and curvature, and is positioned in relation to element 700 such that element 702 fully receives the propagated wave without diffractive loss.

Figure 8:
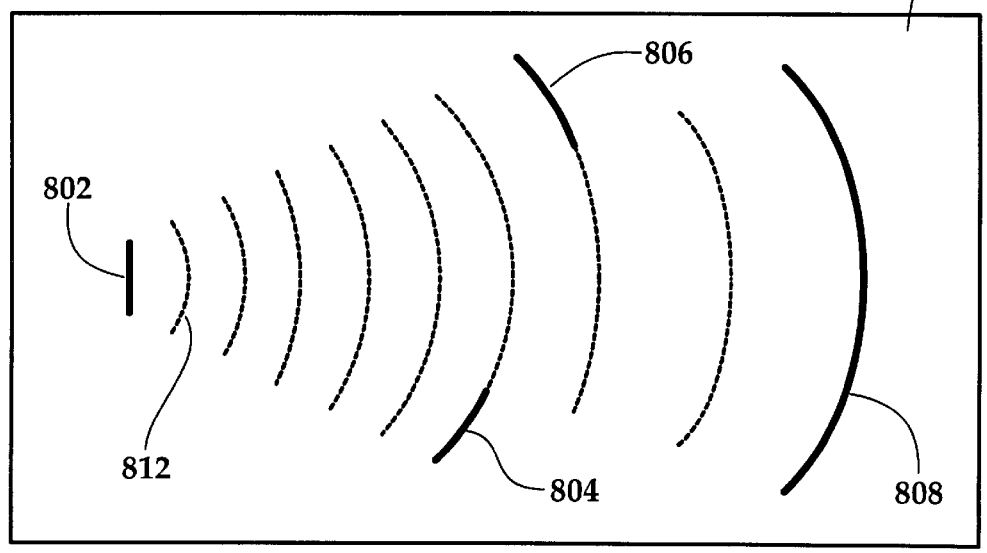
FIG. 8 is a schematic illustration of a linear transmitting electrode and an array of curved receiving electrodes for use with a SAW device, according to the present invention.

Finally, a SAW system 800 according to the present invention is shown in FIG. 8. This embodiment is especially useful in communications applications requiring phase sensitive processing of signals (e.g. Phase Shift Keying), signal processing applications requiring an increase in common mode rejection ratio and other various differential mode based filtering applications. A transmitter 802 and an array of receivers 804, 806, 808 are disposed upon a substrate 810. For purposes of illustration, transmitter 802 is depicted as linear, though it may be shaped in accordance with any of the embodiments previously disclosed. Elements 804, 806, 808 of the array are positioned to receive predetermined segments of the propagating wave fronts 812, allowing the remainder to pass. System 800 may thus provide phase sensitive or differential SAW functionality.

The elements 804, 806, 808 of the array are here depicted as concavely curved with respect to transmitter 802 and with differing curvature radii. These elements may also be shaped in accordance with any of the embodiments previously described.

A SAW device with curved electrodes described herein may be fabricated using conventional photolithographic techniques, widely practiced in the SAW and semiconductor industries in general. A mask or set of masks may be designed and produced using laser scanner or e-beam methods. These masks may be either the electrode image itself or the negative of the electrode pattern; but it is preferable to use the negative pattern, and with it a pre-metallized piezoelectric substrate, because the adhesion quality and electrical properties of the metallization is higher in this case. The piezoelectric substrate, quartz or lithium tantalate, for example, are coated with a photoresist using a spinner. Photolithographic exposure transfers the mask pattern onto the photoresist, and the substrate is then developed chemically to remove the exposed photoresist. In the case of the negative mask and pre-metallized substrate, the metallization is now exposed while the electrode pattern is protected under the photoresist. Acid or, preferably, plasma etching may now be used to erode the metallization in places where it is not desired.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system for transmitting a surface acoustic wave comprising:
    a substantially parabolic transmission element disposed upon a substrate and adapted to propagate an acoustic wave; and
    a curved receiving element disposed upon said substrate in relation to said substantially parabolic transmission element, the curved receiving element adapted to directly receive substantially all of said acoustic wave and match said acoustic wave's size and shape.

2. The system of claim 1 wherein said curved receiving element is convexly curved in relation to said substantially parabolic transmission element.

3. The system of claim 1 wherein said curved receiving element is concavely curved in relation to said substantially parabolic transmission element.

4. The system of claim 1 wherein said substrate comprises a piezoelectric material.

5. The system of claim 1 wherein said substantially parabolic transmission element is convexly curved in relation to said curved receiving element.

6. The system of claim 1 wherein said substantially parabolic transmission element is concavely curved in relation to said curved receiving element.

7. The system of claim 1 wherein said curved receiving element is semi-circular in shape.

8. The system of claim 1 wherein said curved receiving element is semi-elliptical in shape.

9. The system of claim 1 wherein said curved receiving element is substantially parabolic in shape.

10. A method of transmitting a surface acoustic wave comprising the steps of:
    providing a substrate;
    disposing a curved transmission element upon said substrate;
    stimulating said curved transmission element to propagate an acoustic wave along said substrate;
    disposing a semi-elliptical receiving element upon said substrate in relation to said curved transmission element;

matching said acoustic wave's size and shape with said semi-elliptical receiving element; and receiving said acoustic wave with said semi-elliptical receiving element.

11. A method of transmitting a surface acoustic wave comprising the steps of:

providing a substrate;

disposing a substantially-parabolic transmission element upon said substrate;

stimulating said substantially-parabolic transmission element to propagate an acoustic wave along said substrate;

disposing a curved receiving element upon said substrate in relation to said substantially-parabolic transmission element;

matching said acoustic wave's size and shape with said curved receiving element; and receiving said acoustic wave with said curved receiving element.

12. A method of transmitting a surface acoustic wave comprising the steps of:

providing a substrate;

disposing a curved transmission element upon said substrate;

stimulating said curved transmission element to propagate an acoustic wave along said substrate;

disposing a substantially-parabolic receiving element upon said substrate in relation to said curved transmission element;

matching said acoustic wave's size and shape with said substantially-parabolic receiving element; and receiving said acoustic wave with said substantially-parabolic receiving element.

13. A system focusing the transmission of a surface acoustic wave comprising:

a curved transmission element coupled to a substrate, the curved transmission element having a first radius of curvature; and a curved receiving element having a second radius of curvature and coupled to said substrate at a distance from said curved transmission element such that the quotient of said distance divided by said first radius of curvature defines a first factor, such that the quotient of said distance divided by said second radius of curvature defines a second factor, and such that the difference of 1 less said first factor, when multiplied by the difference of 1 less said second factor, is between 0 and 1, inclusive.

14. The system of claim 13 wherein said curved transmission element is semi-circular in shape.

15. The system of claim 13 wherein said curved transmission element is semi-elliptical in shape.

16. The system of claim 13 wherein said curved transmission element is substantially parabolic in shape.

17. The system of claim 13 wherein said curved transmission element is convexly curved in relation to said curved receiving element.

18. The system of claim 13 wherein said curved transmission element is concavely curved in relation to said curved receiving element.

19. The system of claim 13 wherein said curved receiving element is semi-circular in shape.

20. The system of claim 13 wherein said curved receiving element is semi-elliptical in shape.

21. The system of claim 13 wherein said curved receiving element is substantially parabolic in shape.

22. The system of claim 13 wherein said curved receiving element is convexly curved in relation to said curved transmission element.

23. The system of claim 13 wherein said curved receiving element is concavely curved in relation to said curved transmission element.

24. The system of claim 13 wherein said substrate comprises a piezoelectric material.

25. A method of transmitting a surface acoustic wave comprising the steps of:

providing a substrate;

disposing a substantially parabolic transmission element upon said substrate;

stimulating said substantially parabolic transmission element to propagate an acoustic wave along said substrate;

disposing a curved receiving element upon said substrate in relation to said substantially parabolic transmission element so as to directly receive substantially all of the acoustic wave propagated and focused by said substantially parabolic transmission element;

matching said acoustic wave's size and shape with said receiving elements; and receiving said acoustic wave with said curved receiving element.

26. The method of claim 25 wherein the step of providing a substrate further comprises forming said substrate from piezoelectric material.

27. The method of claim 25 wherein the step of providing a curved receiving element further comprises forming said curved receiving element in a substantially parabolic shape.

28. The method of claim 25 wherein the step of providing a curved receiving element further comprises forming said curved receiving element to be convexly curved in relation to said substantially parabolic transmission element.

29. The method of claim 25 wherein the step of providing a curved receiving element further comprises forming said curved receiving element to be concavely curved in relation to said substantially parabolic transmission element.

30. The method of claim 25 wherein the step of providing a substantially parabolic transmission element further comprises forming said substantially parabolic transmission element to be convexly curved in relation to said curved receiving element.

31. The method of claim 25 wherein the step of providing a substantially parabolic transmission element further comprises forming said substantially parabolic transmission element to be concavely curved in relation to said curved receiving element.

32. The method of claim 25 wherein the step of providing a curved receiving element further comprises forming said curved receiving element in a semi-circular shape.

33. The method of claim 25 wherein the step of providing a curved receiving element further comprises forming said curved receiving element in a semi-elliptical shape.

34. A system for transmitting a surface acoustic wave comprising:

a substantially-parabolic transmission element disposed upon a substrate and adapted to propagate an acoustic wave; and a curved receiving element disposed upon said substrate in relation to said substantially-parabolic transmission element, the curved receiving element adapted to receive said acoustic wave and match said acoustic wave's size and shape.

35. A system for transmitting a surface acoustic wave comprising:
   a curved transmission element disposed upon a substrate and adapted to propagate an acoustic wave; and
   a substantially-parabolic receiving element disposed upon said substrate in relation to said curved transmission element, the substantially-parabolic receiving element adapted to receive said acoustic wave and match said acoustic wave's size and shape.

36. A method of transmitting a surface acoustic wave comprising the steps of:
   providing a substrate;
   disposing a semi-elliptical transmission element upon said substrate;
   stimulating said semi-elliptical transmission element to propagate an acoustic wave along said substrate;
   disposing a curved receiving element upon said substrate in relation to said semi-elliptical transmission element;
   matching said acoustic wave's size and shape with said receiving elements; and
   receiving said acoustic wave with said curved receiving element.

37. A device for transmitting a surface acoustic wave comprising:
   a curved transmission element disposed upon a substrate and adapted to propagate and focus an acoustic wave;
   a first curved receiving element disposed upon said substrate in relation to said curved transmission element, and adapted to receive a first portion of said focused acoustic wave and match the first portion of said focused acoustic wave's size and shape; and
   a second curved receiving element disposed upon said substrate in relation to said curved transmission element and said first curved receiving element, and adapted to receive a second portion of said focused acoustic wave and match the second portion of said focused acoustic wave's size and shape.

38. A system for transmitting a surface acoustic wave comprising:
   a semi-elliptical transmission element disposed upon a substrate and adapted to propagate an acoustic wave; and
   a curved receiving element disposed upon said substrate in relation to said semi-elliptical transmission element, the curved receiving element adapted to receive said acoustic wave and match said acoustic wave's size and shape.

39. A system for transmitting a surface acoustic wave comprising:
   a curved transmission element disposed upon a substrate and adapted to propagate an acoustic wave; and
   a semi-elliptical receiving element disposed upon said substrate in relation to said curved transmission element, the semi-elliptical receiving element adapted to receive said acoustic wave and match said acoustic wave's size and shape.

\* \* \* \* \*